United States Patent
Cho et al.

(10) Patent No.: US 6,969,639 B2
(45) Date of Patent: Nov. 29, 2005

(54) WAFER LEVEL HERMETIC SEALING METHOD

(75) Inventors: Chang-ho Cho, Seoul (KR);
Hyung-jae Shin, Gyeonggi-do (KR);
Woon-bae Kim, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 09/984,734

(22) Filed: Oct. 31, 2001

(65) Prior Publication Data

US 2002/0113296 A1 Aug. 22, 2002

(30) Foreign Application Priority Data

Feb. 3, 2001 (KR) .......................................... 2001-5256

(51) Int. Cl.[7] .......................... H01L 21/44; H01L 21/48; H01L 21/50
(52) U.S. Cl. ........................ 438/118; 438/125; 257/704; 257/783
(58) Field of Search ................................ 438/118, 125, 438/110, 113, 108, 119, 458; 257/704, 783, 659

(56) References Cited

U.S. PATENT DOCUMENTS

| | | | |
|---|---|---|---|
| 4,824,511 A * | 4/1989 | Hartman et al. | 156/306.6 |
| 5,534,725 A * | 7/1996 | Hur | 257/434 |
| 5,962,917 A * | 10/1999 | Moriyama | 257/697 |
| 6,255,741 B1 | 7/2001 | Yoshihara et al. | |
| 6,297,072 B1 | 10/2001 | Tilmans et al. | |
| 6,303,986 B1 * | 10/2001 | Shook | 257/680 |
| 6,383,835 B1 * | 5/2002 | Hata et al. | 438/65 |
| 6,441,481 B1 * | 8/2002 | Karpman | 257/711 |
| 6,602,740 B1 * | 8/2003 | Mitchell | 438/127 |
| 6,621,161 B2 * | 9/2003 | Miyawaki | 257/723 |
| 6,743,656 B2 * | 6/2004 | Orcutt et al. | 438/66 |
| 2002/0094662 A1 * | 7/2002 | Felton et al. | 438/458 |
| 2002/0171131 A1 * | 11/2002 | Denton et al. | 257/678 |

FOREIGN PATENT DOCUMENTS

| | | |
|---|---|---|
| DE | 19911916 A1 | 9/1999 |
| EP | 0951068 A1 | 10/1999 |
| EP | 1041628 A2 | 10/2000 |
| JP | 6318625 | 11/1994 |
| JP | 2000-031349 | 1/2000 |
| JP | 2000-141300 | 5/2000 |
| JP | 2000-311961 | 11/2000 |
| JP | 2000-323614 | 11/2000 |

OTHER PUBLICATIONS

Sawara Kunizo, Patent Abstracts of Japan, Semiconductor integrated circuit device and fabrication thereof (Publication numb 03–187247) Aug. 15, 1991.*
U.S. Appl. No. 11/087,552, Chang–ho Cho et al., filed Mar. 24, 2005.

* cited by examiner

*Primary Examiner*—W. David Coleman
*Assistant Examiner*—Khiem D. Nguyen
(74) *Attorney, Agent, or Firm*—Stein, McEwen & Bui, LLP

(57) ABSTRACT

A device that is hermetically sealed at a wafer level or a method of hermetically sealing a device, which is sensitive to high temperatures or affected by heating cycles. Semiconductor devices are formed on a wafer. A lid wafer is formed. Adhesives are formed in a predetermined position over the wafer and/or the lid wafer. The wafer and the lid wafer are sealed by the adhesives at the wafer level. The sealing may be performed at a low temperature using a solder to protect the devices sensitive to heat. The sealed devices are diced into individual chips. In the wafer level hermetic sealing method, a sawing operation is performed after the devices are sealed. Therefore, the overall processing time is reduced, devices are protected from the effects of moisture or particles, and devices having a moving structure, such as MEMS devices, are more easily handled.

28 Claims, 4 Drawing Sheets

WAFER LEVEL HERMETIC SEALING METHOD

CROSS-REFERENCE TO RELATED APPLICATION

This application claims the benefit of Korean Application No. 2001-5256, filed Feb. 3, 2001, in the Korean Industrial Property Office, the disclosure of which is incorporated herein by reference.

BACKGROUND OF THE INVENTION

1. Field of the Invention

The present invention relates to a semiconductor device with a wafer level hermetic seal and a method of hermetically sealing a device at the wafer level. More particularly, the present invention relates to a method of hermetically sealing a semiconductor device which is at a wafer level where the device sensitive to high temperatures or affected by a heat cycle can be thermally sealed at a low temperature and is not affected by moisture or particles.

2. Description of the Related Art

Referring to FIGS. 1 and 2, the surfaces of a conventional semiconductor devices, such as MicroElectroMechanical Systems (MEMS), are first micro-machined in order to hermetically seal the devices. The surface micro-machining is a method by which a sacrificial layer is formed, a structure is formed thereon, and then the sacrificial layer is removed, thereby forming a moving structure. In the case where the surface micro-machining is used, structures or semiconductor devices are formed on a wafer (not shown) in a state in which the sacrificial layer (also not shown) is not removed (S201). Then the wafer is sawed in half (S203) and the sacrificial layer is etched to form moving structures (S205). The resulting moving structures must be carefully handled because these structures can be damaged or rendered completely inoperative by a single microscopic particle. Thus, a first anti-stiction film is coated on the wafer (S207) to prevent dust or particles from attaching to the moving structures. This coating also protects the moving structures during the physical moving, handling and testing of the devices. The anti-stiction film is a film that prevents dust or particles from being attached to a surface by lowering the surface energy of the surface.

After the first anti-stiction film coating, each individual device is tested according to a first test (S210). Since the unit cost of a packaging process is high, this first test is necessarily performed to seek high quality devices. The atmosphere where the first test is carried out must be adjusted so that there is almost no moisture therein. By adjusting the atmosphere, high quality devices can be prevented from being transformed into low quality ones during the testing process. The wafer is sawed into individual chips after the testing is completed (S213). Here, a high percentage of the chips become defective due to the particles generated during the sawing process. The equipment used in a general semiconductor process cannot be used during the sawing process, while additional equipment for fabricating devices such as MEMS is required. This results in an increase in the production cost.

Each individual chip 105 is attached to a package 100 by a die adhesive 103 (S215) and electrically connected to the package 100 by a wire-bonding process 118 (S217). Here, the chip is exposed to the outside environment, and moisture or particles can attach to the chip if the anti-stiction film becomes contaminated. Therefore, a cleaning process is performed to remove such particles (S220). However, a second anti-stiction film coating is necessarily required because the first anti-stiction film may also be removed during the cleaning process (S223). Even if the first anti-stiction film is not removed during the cleaning process, surfaces of the chip with prolonged exposure to air will absorb the moisture, making the second anti-stiction film coating necessary. The package containing the chip is now also coated with the second anti-stiction film.

The lid 115 is aligned with the package 100, which is coated with the second anti-stiction film, and hermetically sealed with a seal ring 110 (S225). Here, reference numeral 113 represents a lid frame. By-products, moisture, and particles are generated when the chip 105 is first tested in an unsealed state and then attached to the package 100. These factors can damage the device or make the device completely inoperable. Therefore, a second test is performed after the seal (S227).

As described above, performing the hermetic sealing process in a chip state is costly as well as labor and time intensive. An increase in cost is attributable to additional equipment needed to carefully handle the MEMS devices or chips having moving structures. In addition, maintaining a multiple work environment such as two anti-stiction coating lines and two testing lines is also costly, and labor and time intensive. In particular, the second anti-stiction film is coated on every package before sealing. This process is slow because the area of the package to be coated is large, thereby requiring a large amount of time to coat the anti-stiction film.

The method of hermetically sealing the package 100 and the lid 115 includes welding and glass high temperature splicing. In a typical welding process, the lid frame 113 is attached to the lid 115 while the seal ring 110 is placed in-between the package 100 and the lid 115. Then the lid 115 along with the seal ring 110 is attached to the package 100 by welding. Here, a high-priced ceramic or metal is used to ensure the hermetic state.

A wafer level bonding method includes silicon-silicon fusion bonding, silicon-glass anodic bonding, eutectic bonding using a medium such as Au, and bonding using a glass frit. In these methods, the cleanness of a surface to be sealed is very important and high temperature or pressure is required.

Accordingly, these methods are not appropriate for devices such as MEMS, which use aluminum actuators having a relatively low fusion temperature. In the case of a silicon-glass anodic bonding method, bonding is performed at a relatively low temperature of about 450 C. However, even a temperature of about 450 C is too high for aluminum actuators and high pressure, which may negatively affect the device, is required .

SUMMARY OF THE INVENTION

To solve the above mentioned problems, it is an object of the present invention to provide a semiconductor device or chip with a wafer level hermetic seal and/or a wafer level hermetic sealing method by which semiconductor device(s) can be sealed at a wafer level so as not to be affected by moisture or particles, and at a low temperature so as to be appropriate for devices such as MEMS structures, which are sensitive to high temperature.

Additional objects and advantages of the invention will be set forth in part in the description which follows and, in part, will be obvious from the description, or may be learned by practice of the invention.

Accordingly, to achieve the above and other objects, there is provided a wafer level hermetic sealing method. In the method, semiconductor devices are formed on a wafer. A lid wafer is formed. Adhesives are formed in a predetermined position over the wafer and/or the lid wafer. The wafer and the lid wafer are sealed together by the adhesives. The sealed wafer-level devices are diced into an individual wafer level chip.

The adhesives are formed of one of In, Sn, Ag, Pb, Zn, Au, Bi, Sb, Cd, Ga and Cu, or an allay of two or more of these metals. The adhesives are formed of a material having a fusion point of 100~300° C. The adhesives are formed by deposition or sputtering. In the operation of forming the adhesives, adhesive promoters are formed over the wafer and/or the lid wafer to promote adhesion of the adhesives. In the operation of forming the adhesive promoters, the adhesives and the adhesive promoters are disposed to align the wafer with the lid wafer. The adhesive promoters are formed of metal or polymer. Electrical connectors may be formed on the wafer to transceive an electrical signal. In the operation of forming the lid wafer, a hole may be formed in a predetermined position so that the electrical connectors are electrically connected to the outside via an interconnection line passing through the hole.

BRIEF DESCRIPTION OF THE DRAWINGS

The above object and advantages of the present invention will become more apparent by describing in detail a preferred embodiment thereof with reference to the attached drawings in which.

DESCRIPTION OF THE PREFERRED EMBODIMENT

Figure 1:
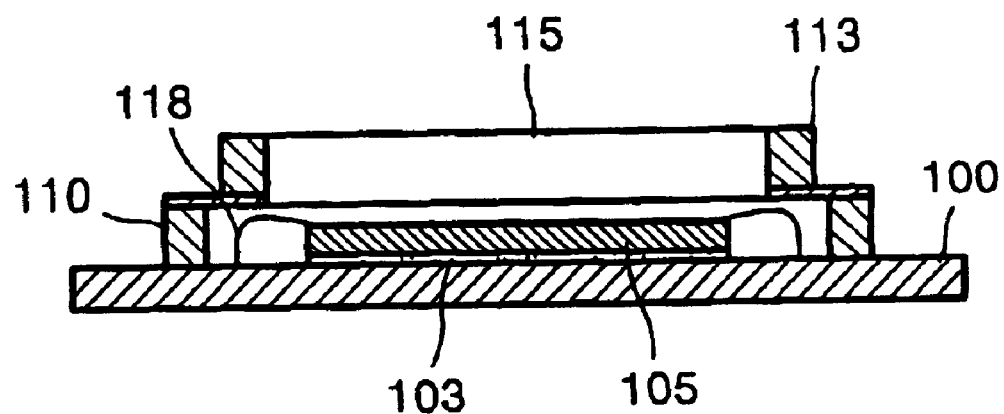
FIG. 1 is a cross-sectional view of semiconductor chip packaged according to a conventional sealing method.
Figure 2:
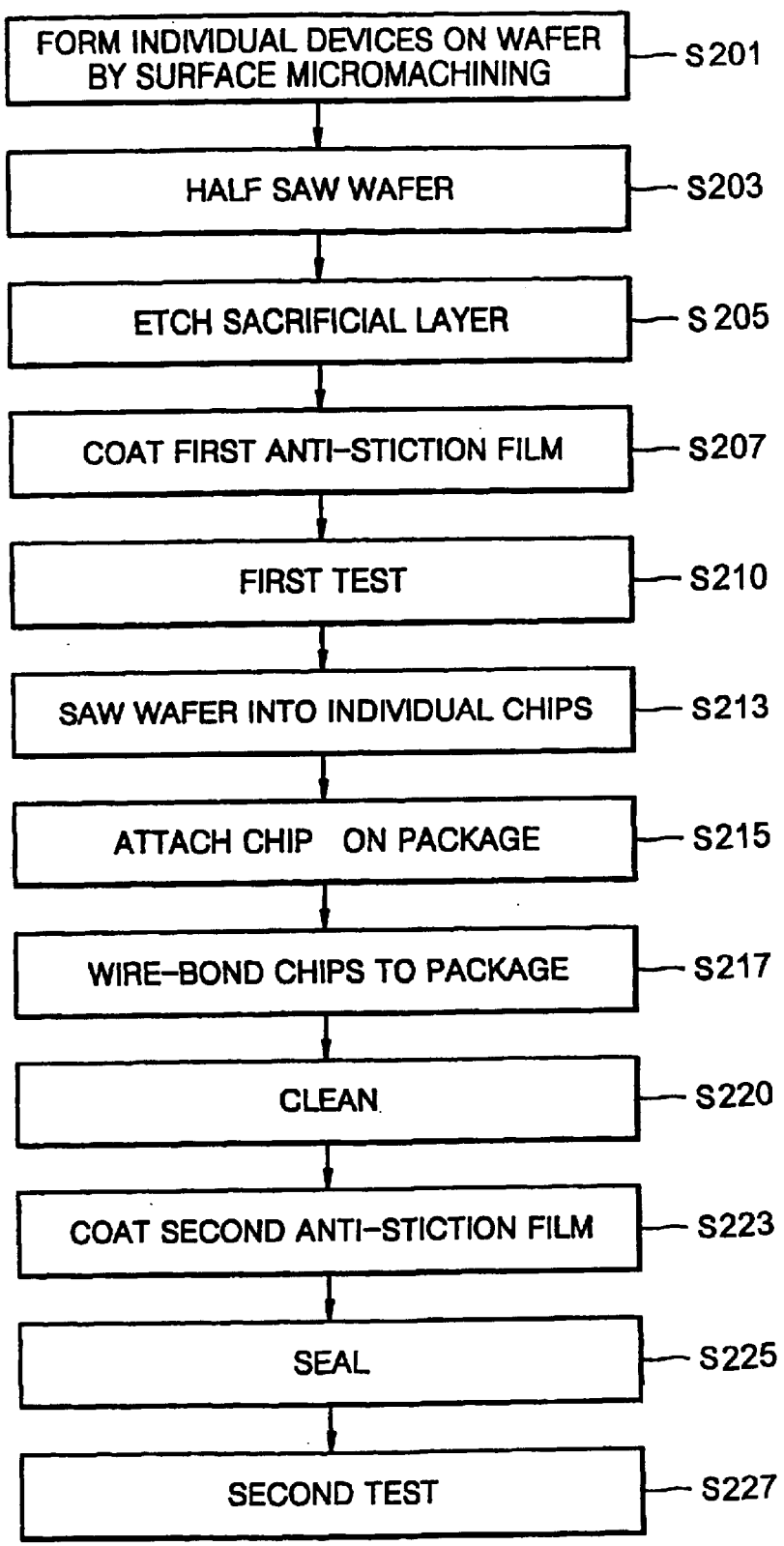
FIG. 2 is a flowchart showing the conventional sealing method.

Reference will now be made in detail to the present preferred embodiments of the present invention, examples of which are illustrated in the accompanying drawings, wherein like reference numerals refer to the like elements throughout. The embodiments are described below in order to explain the present invention by referring to the figures.

Referring to FIGS. 3A through 3E, in the wafer level sealing method of the present invention, semiconductor devices are formed at a wafer level, additional lids are also formed at a wafer level, and the semiconductor devices and the lids are sealed at a low temperature using an adhesive.

Figure 3A:
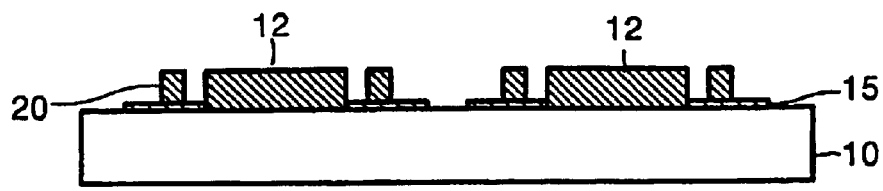
FIGS. 3A through 3E are drawings describing semiconductor device(s) with a wafer level hermetic seal and/or method of hermetically sealing device(s) at a wafer level according to the present invention.

As shown in FIG. 3A, semiconductor devices 12 are formed on a wafer 10. Electrical connectors 15 for electrical connection with the outside may be formed.

Figure 3B:
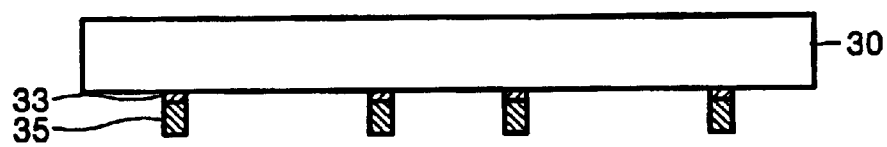

As shown in FIG. 3B, a lid wafer 30 for transceiving an optical signal is prepared apart from the wafer 10. Adhesives 35 are formed to bond the wafer 10 and the lid wafer 30 together. The lid wafer 30 may be formed of transparent materials such as glass in order to exchange an optical signal with the outside. Here, the adhesives 35 are formed on the lid wafer 30 but may be formed on the wafer 10. The adhesives 35 may use solder, metal, or organic sealant, may have a preformed shape, and may be deposited by deposition or sputtering.

Also, adhesive promoters 20 and 33 may be further formed over the wafer 10 and/or the lid wafer 30 to promote adhesion of the adhesives 35 before the adhesives 35 are formed. Here, the adhesive promoters 20 and 33 may be formed of metal or polymer. Particularly, the adhesives 35 and the adhesive promoters 20 and 33 are formed so as to align the wafer 10 with the lid wafer 30, thereby easily and accurately sealing semiconductor devices at a wafer level.

Figure 3C:
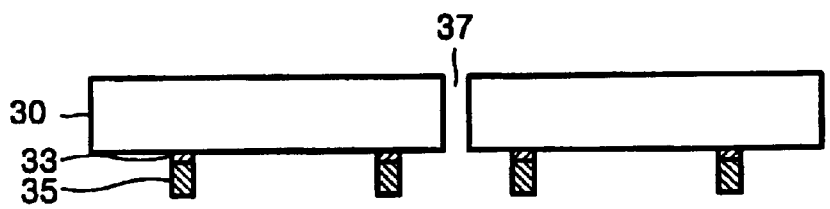
Figure 3D:
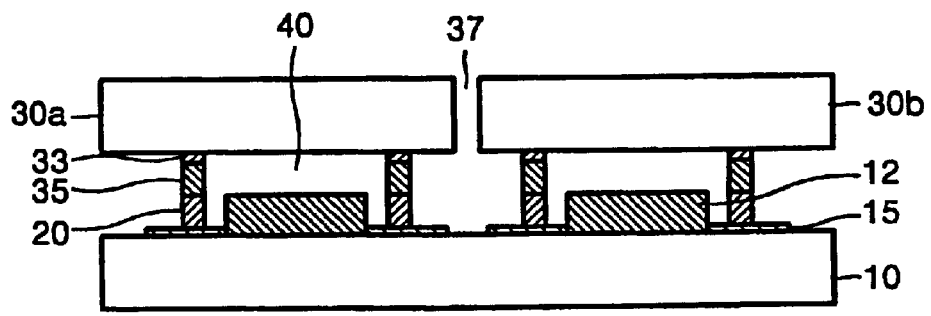

Meanwhile, as shown in FIGS. 3C through 3D, an electrically connective hole 37 may be formed through the lid wafer 30 in order to ensure space necessary for the electrical connection to the electrical connectors 15. In other words, the electrically connective hole 37 is used as a space for an interconnection line when portions of the electrical connectors 15 exposed outside are electrically connected to the outside via an interconnection line.

As described above, the wafer 10 aligns with the lid wafer 30 on the basis of the adhesives 35 and the adhesive promoters 20 and 33 after the wafer 10 and the lid wafer 30 are formed, and the wafer 10 and the lid wafer 30 are sealed under a suitable atmosphere. Here, when the wafer 10 and the lid wafer 30 are sealed, cavities 40 are formed therebetween. A low temperature sealing process is possible if a solder is used as an adhesive in the seating process. Here, the solder is preferably formed of one of In, Sn, Ag, Pb, Zn, Au, Bi, Sb, Cd, Ga and Cu, or an alloy of two or more of these metals. Particularly, the solder is formed of a material having a fusion point of 100~300° C., more preferably, 100~200° C. For example, the material includes BiSnPb, BIPbSn, BiSnCd, Biln, BiPbSnCd, BiSnPbCdCu, InCd, BiPb, lnSn, lnSnPbCd, BiPb, PbBiSn, BiSnlnPb, lnSnPb, BiPbSnAg, InAg, BiCd, InGa, PbBi, SnAg, lnPb, SnZn, SnPbBi, SnPbSb, AuSn, and SnCu and the like.

Figure 3E:
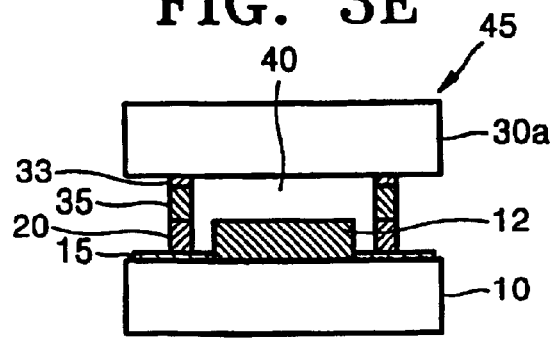

After the sealing process is completed, as shown in FIG. 3E, devices sealed at a wafer level are sawed into individual chips 45. Here, dust, particles, or moisture may not stick to the semiconductor device 12 sealed within the individual chip 45 during the sawing process.

Figure 4:
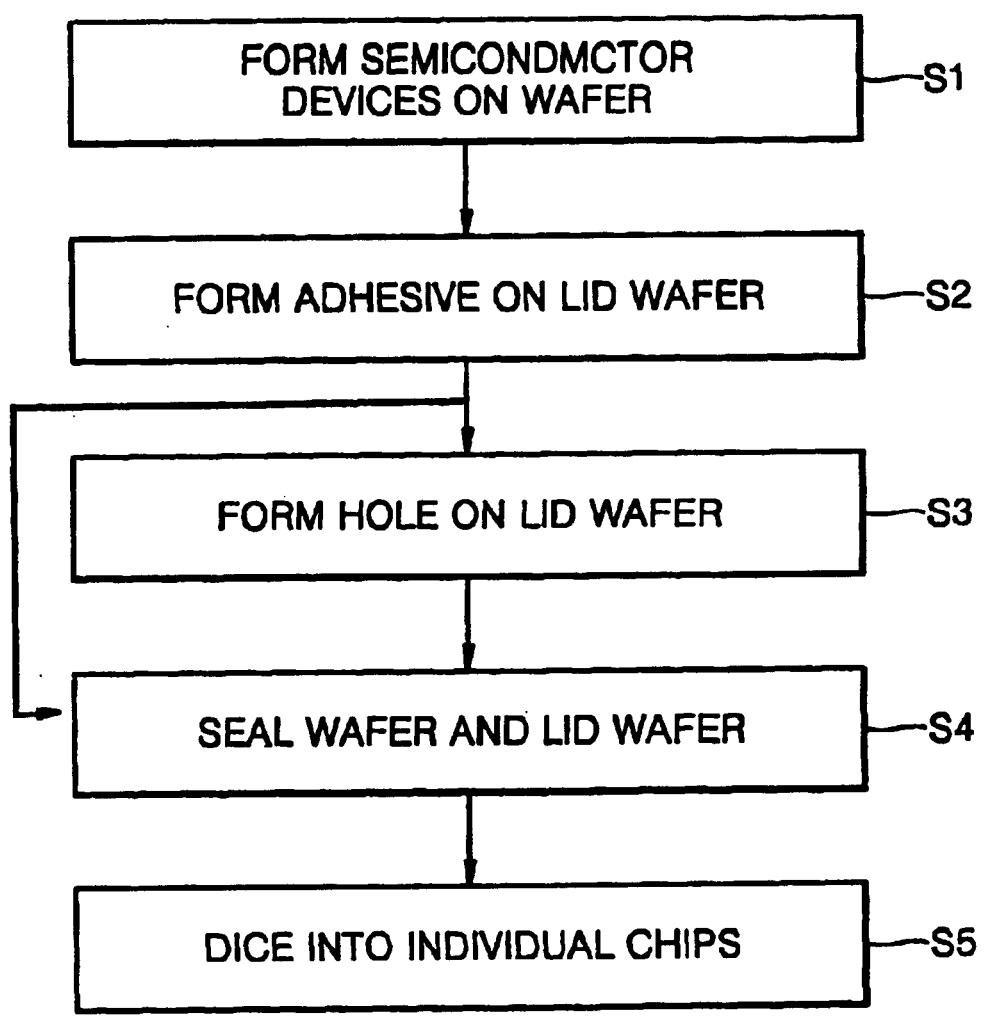
FIG. 4 is a flowchart showing the method of hermetically sealing device(s) at a wafer level according to the present invention.

FIG. 4 shows a flowchart of the wafer level sealing process as described above. Individual semiconductor devices 12 are formed on the wafer 10 (S1). A lid wafer 30 is formed apart from the wafer 10 and adhesives 35 are formed in a predetermined position to bond the wafer 10 and the lid wafer 30 (S2). The wafer 10 and the lid wafer 30 are sealed together using the adhesives 35 (S4). The devices formed at a wafer level are diced into individual chips (S5). Here, an operation S3 of forming an electrically connective hole 37 may be further included when the lid wafer 30 is formed in order to ensure a space necessary for an electrical connection.

The wafer level hermetic sealing method according to the present invention can be applied to MEMS devices or chips whose lives are shortened by a stiction phenomenon due to moisture or particles, charged coupled devices (CCD) and sensors requiring the minimization of high temperature, moisture, gas by-products, or particles. Also, the wafer level hermetic sealing method can be applied to general semiconductor devices and hybrid chips for optical communication.

As described above, in the wafer level hermetic sealing method according to the present invention, sealing is performed at a wafer level and thus the overall required processing time is reduced. It is easier to handle MEMS devices or chips having the moving structures and production cost is reduced due to the use of existing dicing processes. Also, in the present invention, sealing is performed right after the moving structures are formed. Testing the device and attaching the device to a package are performed in a sealed state. Therefore, detrimental effects due to dust, particles or moisture generated during the testing process can be excluded.

Also, the hermetic sealing process can be performed at a low temperature using a solder and thus it can be applied to semiconductor devices sensitive to heat.

Although a few preferred embodiments of the present invention have been shown and described, it would be appreciated by those skilled in the art that changes may be made in this embodiment without departing from the principles and spirit of the invention, the scope of which is defined in the claims and their equivalents.

What is claimed is:

1. A wafer level hermetic sealing method comprising:
   forming semiconductor devices on a device side of a wafer;
   forming a lid wafer having a front side and a through hole at a predetermined position, with the through hole being formed before the wafer and the lid wafer are sealed;
   forming adhesives in predetermined positions over the device side of the wafer or the front side of the lid wafer;
   sealing the device side of the wafer and the front side of the lid wafer with the adhesives; and
   dicing the sealed wafer-level devices into individual chips,
   wherein the adhesives are formed of a material having a fusion point of 100~300° C.

2. The wafer level hermetic sealing method of claim 1, wherein the adhesives are formed of one selected from the group consisting of In, Sn, Ag, Pb, Zn, Au, Bi, Sb, Cd, Ga and Cu, or an alloy of two or more of these metals.

3. The wafer level hermetic sealing method of claim 2, wherein the forming of the adhesives comprises depositing or sputtering the adhesives.

4. The wafer level hermetic sealing method of claim 2, wherein the forming of the adhesives comprises forming adhesive promoters over the device side of the wafer and/or the front side of the lid wafer to promote adhesion of the adhesives.

5. The wafer level hermetic sealing method of claim 4, wherein the forming of the adhesive promoters comprises disposing the adhesives and the adhesive promoters to align the wafer with the lid wafer.

6. The wafer level hermetic sealing method of claim 4, wherein the adhesive promoters are formed of metal or polymer.

7. The wafer level hermetic sealing method of claim 2, further comprising forming electrical connectors on the wafer to transceive an electrical signal.

8. The wafer level hermetic sealing method of claim 7, wherein the forming of the lid wafer further comprises forming the through hole in a predetermined position so that the electrical connectors are electrically connectable to the outside via an interconnection line passing through the through hole.

9. The wafer level hermetic sealing method of claim 2, wherein the adhesives have a preformed shape.

10. The wafer level hermetic sealing method of claim 2, wherein the lid wafer is a transparent material to exchange an optical signal.

11. The wafer level hermetic sealing method of claim 1, wherein the adhesives are formed by deposition or sputtering.

12. The wafer level hermetic sealing method of claim 1, wherein the forming of the adhesives comprises forming adhesive promoters over the device side of the wafer and/or the front side of the lid wafer to promote adhesion of the adhesives.

13. The wafer level hermetic sealing method of claim 12, wherein the forming of the adhesive promoters comprises disposing the adhesives and the adhesive promoters to align the wafer with the lid wafer.

14. The wafer level hermetic sealing method of claim 12, wherein the adhesive promoters are formed of metal or polymer.

15. The wafer level hermetic sealing method of claim 1, further comprising forming electrical connectors on the wafer to transceive an electrical signal.

16. The wafer level hermetic sealing method of claim 15, wherein the forming of the lid wafer further comprises forming the through hole in a predetermined position so that the electrical connectors are electrically connectable to the outside via an interconnection line passing through the through hole.

17. The wafer level hermetic sealing method of claim 1, wherein the adhesives have a preformed shape.

18. The wafer level hermetic sealing method of claim 1, wherein the lid wafer is a transparent material to exchange an optical signal.

19. The wafer level hermetic sealing method of claim 1, wherein the adhesives are formed of solder, metal, or an organic sealant.

20. The wafer level hermetic sealing method of claim 1, wherein the semiconductor devices are microelectromechanical systems (MEMS) devices.

21. The wafer level hermetic sealing method of claim 1, wherein the semiconductor devices are charge coupled devices.

22. The wafer level hermetic sealing method of claim 1, wherein the semiconductor devices are sensors.

23. A method comprising:
    forming semiconductor devices on a wafer;
    adhering a lid wafer, having a through hole at a predetermined position and formed before the wafer and the lid wafer are sealed at a wafer level, to the wafer;
    sealing the wafer and the lid wafer at the wafer level; and
    separating the sealed semiconductor devices into individual chips,
    wherein the adhering comprises adhering the wafer and the lid wafer using adhesives comprising a material having a fusion point of 100~300° C.

24. The method of claim 23, wherein:
    the adhering further comprises:
      forming the adhesives at predetermined positions on at least one of the lid wafer and the wafer, and
      adhering the wafer and the lid wafer with the adhesives so that enclosures with cavities are formed by the lid wafer, the wafer and the adhesives, wherein the semiconductor devices are within the cavities; and
    the separating comprises separating the sealed semiconductor devices at positions between the enclosures.

25. The method of claim 23, wherein the semiconductor devices are micro-electromechanical systems (MEMS) devices.

26. The method of claim 23, further comprising attaching the individual chips to a package after the sealing of the wafer and the lid wafer.

27. A method comprising:

forming semiconductor devices on a wafer;

adhering a lid wafer, having a through hole at a predetermined position, to the wafer using adhesives made of a material having a fusion point of 100~300° C. with the through hole being formed before the lid wafer is adhered to the wafer;

sealing the wafer and the lid wafer at a wafer level; and separating the sealed semiconductor devices into individual chips.

28. The method of claim 27, wherein the material is solder.

* * * * *